United States Patent
Ng et al.

(10) Patent No.: US 12,176,327 B2
(45) Date of Patent: *Dec. 24, 2024

(54) METHOD FOR FABRICATING ELECTRONIC PACKAGE

(71) Applicant: SILICONWARE PRECISION INDUSTRIES CO., LTD., Taichung (TW)

(72) Inventors: Kong-Toon Ng, Taichung (TW); Hung-Ho Lee, Taichung (TW); Chee-Key Chung, Taichung (TW); Chang-Fu Lin, Taichung (TW); Chi-Hsin Chiu, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/309,756

(22) Filed: Apr. 28, 2023

(65) Prior Publication Data

US 2023/0268328 A1 Aug. 24, 2023

Related U.S. Application Data

(60) Continuation of application No. 17/337,752, filed on Jun. 3, 2021, now Pat. No. 11,676,948, which is a (Continued)

(30) Foreign Application Priority Data

Jun. 20, 2019 (TW) ................. 108121501

(51) Int. Cl.
H01L 25/10 (2006.01)
H01L 21/56 (2006.01)
(Continued)

(52) U.S. Cl.
CPC .......... H01L 25/105 (2013.01); H01L 21/568 (2013.01); H01L 24/16 (2013.01);
(Continued)

(58) Field of Classification Search
CPC ..... H01L 25/105; H01L 25/50; H01L 21/568; H01L 24/16; H01L 24/24; H01L 24/81;
(Continued)

(56) References Cited

U.S. PATENT DOCUMENTS

| 11,676,948 B2 * | 6/2023 | Ng | H01L 21/6835 257/737 |
| 2020/0058627 A1 * | 2/2020 | Chen | H01L 23/3135 |
| 2020/0075562 A1 * | 3/2020 | Yu | H01L 25/0657 |

* cited by examiner

Primary Examiner — Tu-Tu V Ho
(74) Attorney, Agent, or Firm — Studebaker & Brackett PC

(57) ABSTRACT

An electronic package is provided, including: an encapsulation layer embedded with a first electronic component and conductive pillars; a circuit structure disposed on one surface of the encapsulation layer; a second electronic component disposed on the circuit structure; an insulation layer formed on the other surface of the encapsulation layer; and a circuit portion disposed on the insulation layer. Since the first and second electronic components are disposed on two sides of the circuit structure, respectively, the electronic package has various functions and high performance. A method for fabricating the electronic package is also provided.

10 Claims, 6 Drawing Sheets

Related U.S. Application Data division of application No. 16/513,124, filed on Jul. 16, 2019, now Pat. No. 11,056,470.

(51) Int. Cl.
*H01L 23/00* (2006.01)
*H01L 25/00* (2006.01)

(52) U.S. Cl.
CPC .............. *H01L 24/24* (2013.01); *H01L 24/81* (2013.01); *H01L 24/82* (2013.01); *H01L 25/50* (2013.01); *H01L 2224/16145* (2013.01); *H01L 2224/24153* (2013.01); *H01L 2224/73209* (2013.01); *H01L 2224/82005* (2013.01); *H01L 2225/1035* (2013.01); *H01L 2225/1041* (2013.01); *H01L 2225/1058* (2013.01)

(58) Field of Classification Search
CPC ........... H01L 24/82; H01L 2224/16145; H01L 2224/24153; H01L 2224/73209; H01L 2224/82005; H01L 2225/1035; H01L 2225/1041; H01L 2225/1058
USPC ........................................................ 257/737
See application file for complete search history.

METHOD FOR FABRICATING ELECTRONIC PACKAGE

BACKGROUND

1. Technical Field

The present disclosure relates to semiconductor package techniques, and, more particularly, to an electronic package and a method for fabricating the same.

2. Description of the Prior Art

With the rapid development of electronic industry, electronic products have various functions and high performance. In order to meet the packaging demand for electronic package miniaturization, a wafer level packaging (WLP) technique came to the market.

FIGS. 1A to 1E are cross-sectional views illustrating a method for fabricating a semiconductor package 1 by using the WLP technique according to the prior art.

As shown in FIG. 1A, a thermal release tape 100 is formed on a carrier 10.

A plurality of semiconductor elements 11 are disposed on the thermal release tape 100. Each of the semiconductor elements 11 has an active surface 11a adhered to the thermal release tape 100 and having a plurality of electrode pads 110 disposed thereon, and an inactive surface 11b opposing the active surface 11a.

As shown in FIG. 1B, a molding compound 14 is formed on the thermal release tape 100 and encapsulates the semiconductor elements 11.

As shown in FIG. 1C, the molding compound 14 is toasted and the thermal release tape 100 is cured; and the thermal release tape 100 and the carrier 10 are removed to expose the active surfaces 11a of the semiconductor elements 11.

As shown in FIG. 1D, a circuit structure 16 is disposed on the molding compound 14 and the active surface 11a of the semiconductor elements 11 and electrically connected to the electrode pads 110. An insulation protection layer 18 is formed on the circuit structure 16, with a portion of a surface of the circuit structure 16 being exposed from the insulation protection layer 18, allowing conductive elements 17, such as solder balls, to be bonded thereto.

As shown in FIG. 1E, a singulation process is performed along a cutting path L shown in FIG. 1D, to obtain a plurality of the semiconductor packages 1.

In the semiconductor package 1, the semiconductor elements 11 are disposed on only one side of the circuit structure 16. Accordingly, the semiconductor package 1 and an end electronic product having the same have limited functions and performance.

Therefore, how to solve the problems of the prior art is becoming an urgent issue in the art.

SUMMARY

In view of the problems of the prior art, the present disclosure provides a method for fabricating an electronic package, comprising: providing a carrying board having an insulation layer; disposing a plurality of conductive pillars and a first electronic component on the insulation layer; forming on the insulation layer an encapsulation layer that encapsulates the first electronic component and the conductive pillars and has a first surface, from which an end surface of the conductive pillars is exposed, and a second surface opposing the first surface and bonded to the insulation layer; disposing on the first surface of the encapsulation layer a circuit structure that is electrically connected to the conductive pillars and the first electronic component; disposing on the circuit structure a second electronic component that is electrically connected to the circuit structure; and removing the carrying board, with the insulation layer remained.

The present disclosure also provides an electronic package, comprising: an encapsulation layer having a first surface and a second surface opposing the first surface; a first electronic component embedded in the encapsulation layer; a plurality of conductive pillars embedded in the encapsulation layer; a circuit structure disposed on the first surface of the encapsulation layer and electrically connected to the conductive pillars and the first electronic component; a second electronic component disposed on the circuit structure and electrically connected to the circuit structure; and an insulation layer formed on the second surface of the encapsulation layer.

In an embodiment, a plurality of conductive bodies are disposed on and electrically connected to the first electronic component, embedded in the encapsulation layer, and electrically connected to the circuit structure. In another embodiment, the first electronic component has an active surface bonded and electrically connected to the conductive bodies and an inactive surface opposing the active surface. In yet another embodiment, the first surface of the encapsulation layer is flush with an end surface of the conductive bodies.

In an embodiment, the first surface of the encapsulation layer is flush with an end surface of the conductive pillars.

In an embodiment, the second electronic component is disposed on and electrically connected to the circuit structure via a conductive bump.

In an embodiment, a packaging layer is further formed on the circuit structure and packages the second electronic component.

In an embodiment, a circuit portion is further disposed on the insulation layer and electrically connected to the conductive pillars. In another embodiment, the circuit portion is a conductive pad and/or an under bump metallurgy. In yet another embodiment, a plurality of conductive elements are further disposed on the circuit portion. In still another embodiment, a package substrate is disposed on the circuit portion.

In an embodiment, a portion of a material of an end portion of the conductive pillars is removed, and the conductive pillars have a concave circumferential surface near an end surface thereof.

It is known from the above that in the electronic package and the method for fabricating the same according to the present disclosure, the second electronic component is disposed on the circuit structure. Compared with the prior art, the electronic package according to the present disclosure has the first electronic component and the second electronic component disposed on two sides of the circuit structure, respectively. Therefore, the electronic package has various functions and high performance.

The end surface of the conductive pillars acts as external contacts, and the distance between any two of the external contacts can be controlled to meet the fine-pitch demand. Therefore, conductive elements on the external contacts are prevented from bridging to one another.

DETAILED DESCRIPTION

The following illustrative embodiments are provided to illustrate the disclosure of the present disclosure, these and other advantages and effects can be apparently understood by those in the art after reading the disclosure of this specification.

It should be appreciated that the structures, proportions, size and the like of the figures in the present application are intended to be used in conjunction with the disclosure of the specification. They are not intended to limit the disclosure and therefore do not represent any substantial technical meanings. The details of the specification may be on the basis of different points and applications, and numerous modifications and variations can be devised without departing from the spirit of the present disclosure. As used herein, the terms "over", "first", "second", "a" and the like, are for the purpose of describing particular devices and methods only and is not intended to be limiting of this disclosure. Changes or adjustments are considered to be within the scope of the present disclosure, without departing from the scope of the present disclosure.

FIGS. 2A to 2H are cross-sectional views illustrating a method for fabricating a semiconductor package 2 according to the present disclosure.

Figure 1A:
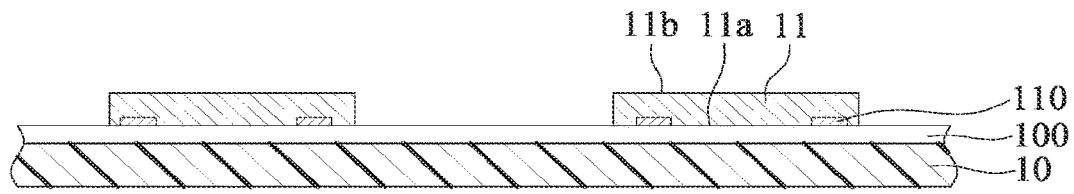
FIGS. 1A to 1E are cross-sectional views illustrating a method for fabricating a semiconductor package according to the prior art.
Figure 1B:
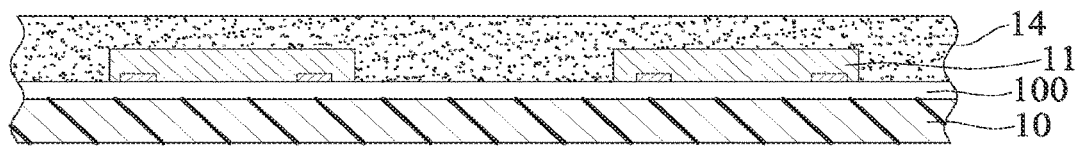
Figure 1C:
Figure 1D:
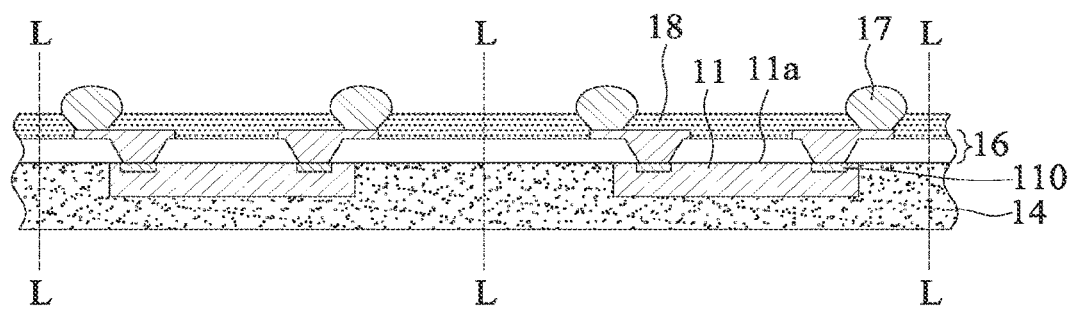
Figure 1E:
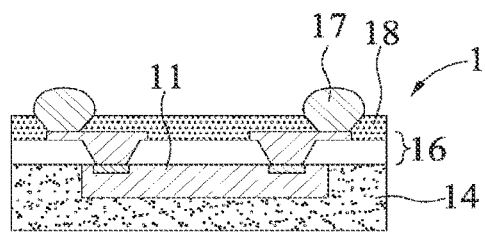
Figure 2A:
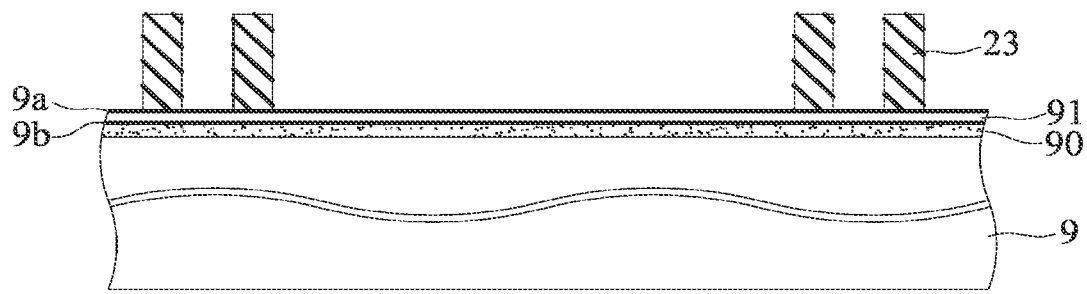
FIGS. 2A to 2H are cross-sectional views illustrating a semiconductor package and methods for fabricating the same according to the present disclosure, wherein FIG. 2B' is a locally enlarged view of FIG. 2B, and FIG. 2G' is a schematic diagram of another aspect of FIG. 2G.
Figure 2B:
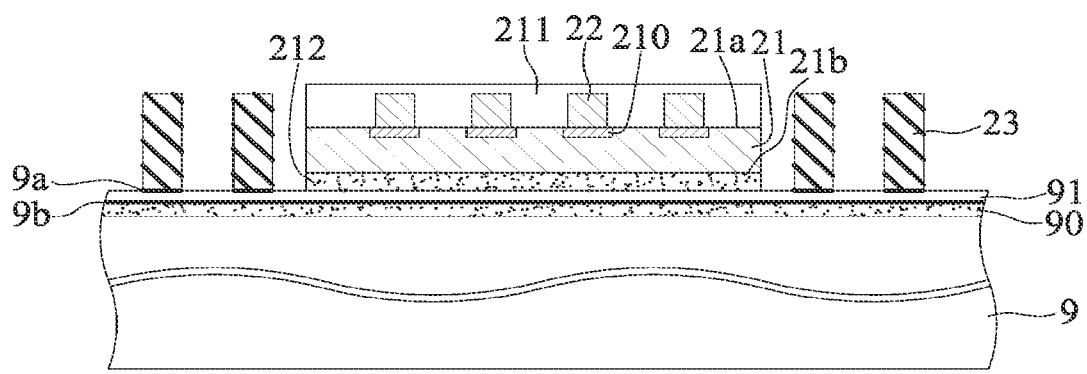
Figure 2B:
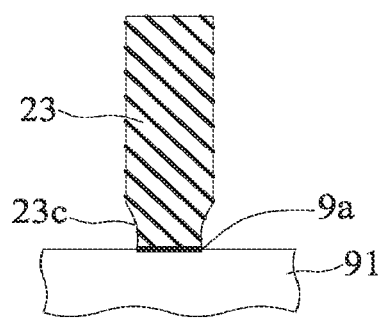

As shown in FIGS. 2A and 2B, a carrying board 9 having a seed layer 9a is provided, and a plurality of conductive pillars 23 are disposed on the carrying board 9 via the seed layer 9a. At least one first electronic component 21 is disposed on the carrying board 9, and a plurality of conductive bodies 22 are bonded and electrically connected to the first electronic component 21. In an embodiment, the conductive bodies 22 are conductive elements in the shape of a ball, such as solder ball or conductive wires; or in the shape of a pillar, such as metal materials such as copper pillars, solder bumps etc.; or in the shape of a stud fabricated by a solder wire machine.

In an embodiment, the carrying board 9 is made of a semiconductor material, such as silicon and glass, and a release layer 90, a metal layer 9b, such as titanium/copper, and an insulation layer 91, such a dielectric material or a solder resist material, are coated on the carry board 9 sequentially, to allow the seed layer 9a to be formed on the insulation layer 91.

In FIG. 2A, a patterned resist layer (not shown) is formed on the seed layer 9a to expose a portion of the surface of the seed layer 9a, for the conductive pillars 23 to be disposed thereon. After the fabrication of the conductive pillars 23, the patterned resist layer and the seed layer 9a thereunder are removed, as shown in FIG. 2B. When the seed layer 9a is etched and removed, an end portion of the conductive pillars 23 will be etched accordingly and form a concave circumferential surface 23c thereon, as shown in FIG. 2B'.

In an embodiment, the conductive pillars 23 are made of metal, such as copper, or a solder material, and the seed layer 9a is made of titanium/copper.

In an embodiment, the first electronic component 21 is an active element, such as a semiconductor chip, a passive element, such as a resistor, a capacitor and an inductor, or a combination thereof. In an embodiment, the first electronic component 21 is a semiconductor chip and has an active surface 21a and an inactive surface 21b opposing the active surface 21a. The inactive surface 21b of the first electronic component 21 is bonded via a bonding layer 212 to the insulation layer 91. A plurality of electrode pads 210 and a protection film 211 made of a passivation material are disposed on the active surface 21a, and the conductive bodies 22 are disposed in the protection film 211.

Figure 2C:
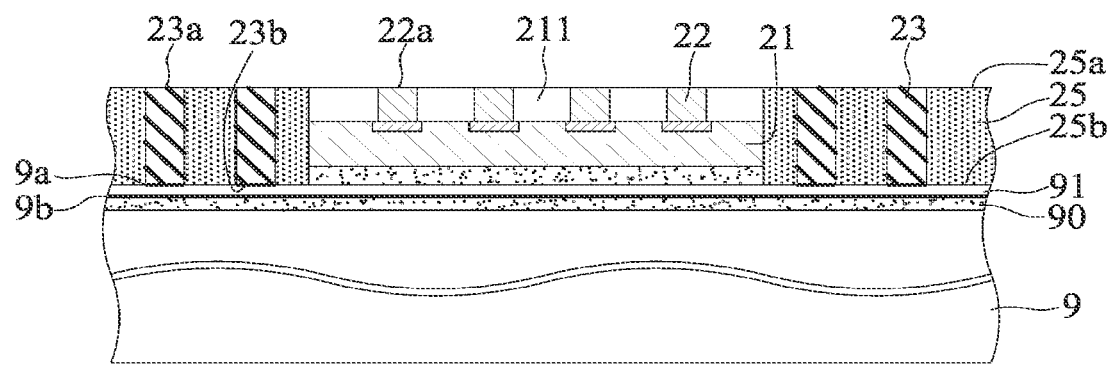

As shown in FIG. 2C, an encapsulation layer 25 is formed on an insulation layer 91 of the carrying board 9 and encapsulates the first electronic component 21, the conductive bodies 22 and the conductive pillars 23. The encapsulation layer 25 has a first surface 25a and a second surface 25b opposing the first surface 25a. The protection film 211, an end surface 22a of the conductive bodies 22, and an end surface 23a of the conductive pillars 23 are exposed from the first surface 25a of the encapsulation layer 25, and the second surface 25b of the encapsulation layer 25 is bonded to the insulation layer 91 of the carrying board 9.

In an embodiment, the encapsulation layer 25 is made of an insulation material, such as polyimide (PI), a dry film, or a molding compound, such as epoxy. In another embodiment, the encapsulation layer 25 is formed on the insulation layer 91 through liquid compound, injection, lamination or compression molding.

In an embodiment, the first surface 25a of the encapsulation layer 25 is flush with the protection film 211, the end surface 23a of the conductive pillars 23, and the end surface 22a of the conductive bodies 22 through a leveling process, and the end surface 23a of the conductive pillars 23 and the end surface 22a of the conductive bodies 22 are exposed from the first surface 25a of the encapsulation layer 25. In an embodiment, in the leveling process, a portion of a material of the protection film 211, a portion of a material of the conductive pillars 23, a portion of a material of the conductive bodies 22 and a portion of a material of the encapsulation layer 25 are ground and removed.

In an embodiment, another end surface 23b of the conductive pillars 23 (with the seed layer 9a neglected) is substantially flush with the second surface 25b of the encapsulation layer 25.

Figure 2D:
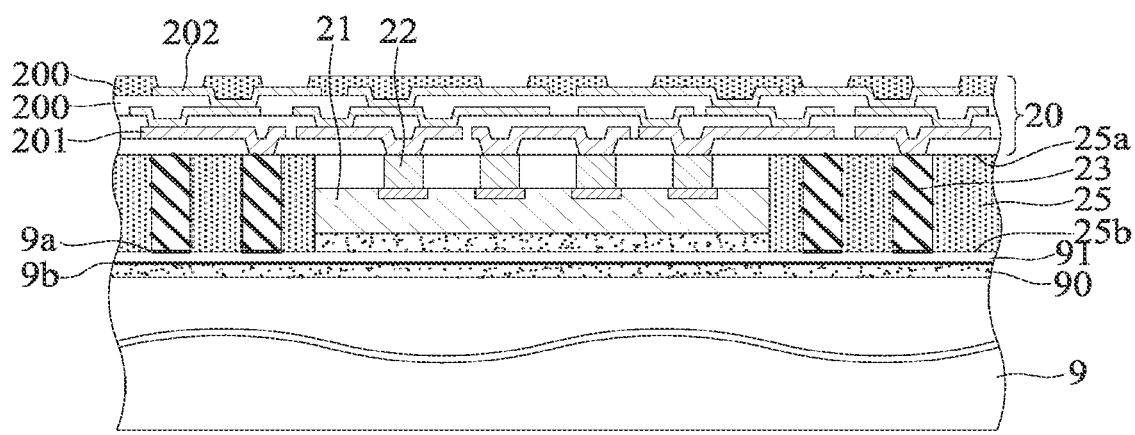

As shown in FIG. 2D, a circuit structure 20 is disposed on the first surface 25a of the encapsulation layer 25 and electrically connected to the conductive pillars 23 and the conductive bodies 22.

In an embodiment, the circuit structure 20 comprises a plurality of insulation layers 200 and a plurality of redistribution layers (RDLs) 201 formed on the insulation layers 200, the outermost one of the insulation layers 200 acts as a solder resist layer, and the outermost one of the RDLs 201 is exposed from the solder resist layer to act as a conductive pad 202, such as a micro pad (μ-pad). In another embodiment, the circuit structure 20 comprises a single insulation layer 200 and a single RDL 201.

In an embodiment, the RDLs 201 are made of copper, and the insulation layers 200 are made of a dielectric material, such as polybenzoxazole (PBO), polyimide (PI), prepreg (PP) etc., or a solder resist material, such as solder mask, solder ink etc.

Figure 2E:
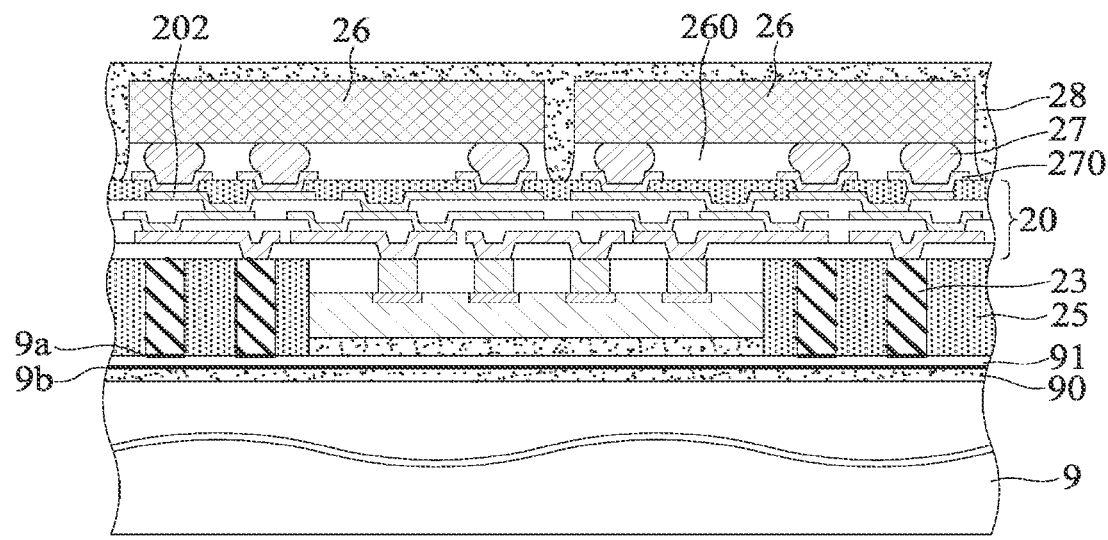

As shown in FIG. 2E, at least one second electronic component 26 is disposed on the circuit structure 20, and a packaging layer 28 packages the second electronic component 26.

In an embodiment, the second electronic component 26 is an active element, such as a semiconductor chip, a passive element, such as a resistor, a capacitor and an inductor, or a combination thereof. In another embodiment, the second electronic component 26 is a semiconductor chip, such as a graphics processing unit (GPU), a high bandwidth memory (HBM) etc.

In an embodiment, the second electronic component 26 is electrically connected to the conductive pad 202 via a plurality of conductive bumps 27, such as solder bumps, copper bumps etc., and the packaging layer 28 packages the second electronic component 26 and the conductive bump 27. In an embodiment, an under bump metallurgy (UBM) 270 is disposed on the conductive pad 202, for the conductive bump 27 to be bonded thereto.

In an embodiment, the packaging layer 28 is made of an insulation material, such as polyimide (PI), a dry film, and a molding compound, such as epoxy, and is formed on the first circuit structure 20 through lamination or molding. The packaging layer 28 and the encapsulation layer 25 can be made of the same or different materials.

In an embodiment, an underfill 260 is formed between the second electronic component 26 and the circuit structure 20 and encapsulates the conductive bumps 27 first, and then the packaging layer 28 is formed to package the underfill 260 and the second electronic component 26.

Figure 2F:
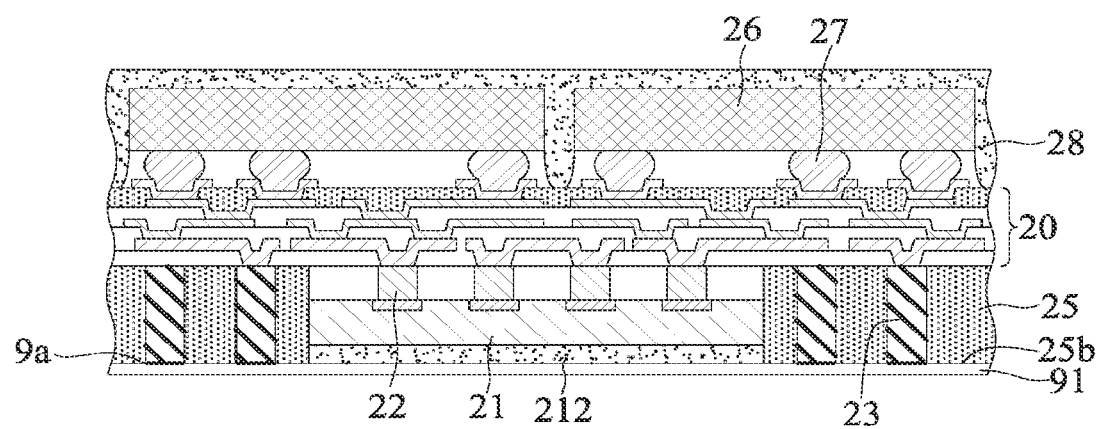

As shown in FIG. 2F, the carrying board 9 and the release layer 90 and the metal layer 9b thereon are removed, with the insulation layer 91 remained.

In an embodiment, after the release layer 90 is released, the metal layer 9b acts as a barrier to protect the insulation layer 91 from being damaged, and the metal layer 9b is etched and removed after the carrying board 9 and the release layer 90 thereon are removed.

Figure 2G:
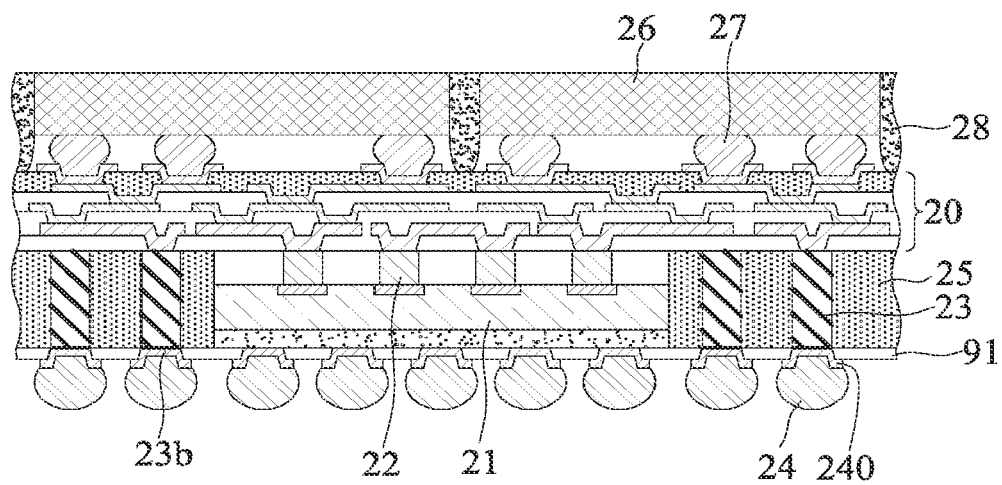
Figure 2G:
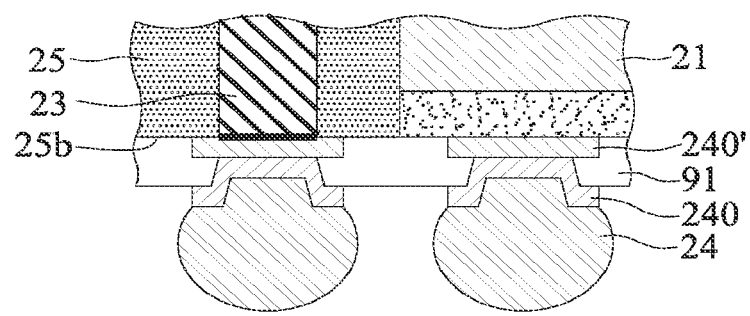

As shown in FIG. 2G, a circuit portion 240 is disposed on the insulation layer 91 and electrically connected to the conductive pillars 23.

In an embodiment, the insulation layer 91 is formed with a plurality of holes through laser, and the end surface 23b of the conductive pillars 23 and a portion of the second surface 25b of the encapsulation layer 25 are exposed from the holes, for the circuit portion 240 to be bonded thereto. In an embodiment, the circuit portion 240 is an under bump metallurgy (UBM) and bonded to a plurality of conductive elements 24, such as solder bumps and solder balls (C4-type). In another embodiment, as shown in FIG. 2G', the circuit portion 240' is a plurality of conductive pads and is disposed on the insulation layer 91 in an RDL process, for the conductive elements 24 or UBM to be bonded thereto.

In a leveling process, a portion of a material of the packaging layer 28 is grounded and removed, an upper surface of the packaging layer 28 is flush with a surface of the second electronic component 26, and the second electronic component 26 is exposed from the packaging layer 28.

Through the provision of the carrying board 9 having the insulation layer 91, after the removal of the carrying board 9, the insulation layer 91 can be used to form the circuit portions 240, 240'. Therefore, no additional dielectric layer is needed, and the fabrication time, step and cost are saved.

Figure 2H:
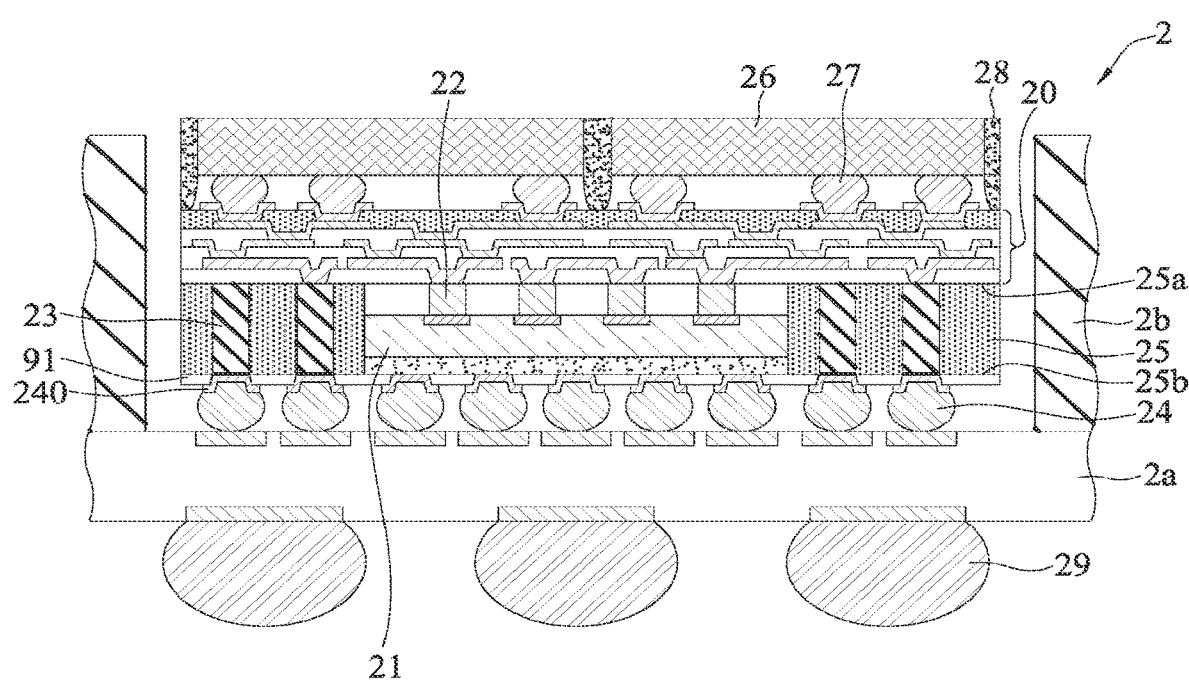

As shown in FIG. 2H, a singulation process is performed along a cutting path S shown in FIG. 2G, to obtain a plurality of package units, which can be disposed via the conductive elements 24 on a package substrate 2a.

In an embodiment, a plurality of conductive elements 29, such as solder balls, are planted on a bottom side of the package substrate 2a, to form the electronic package 2. In a subsequent process, the electronic package 2 is disposed on a circuit board (not shown) via the conductive elements 29 disposed on the bottom side of the package substrate 2a.

In an embodiment, a strength element 2b, such as a metal frame, is disposed on the package substrate 2a on demand to evenly distribute the stress and prevent the package substrate 2a from warpage.

In the method for fabricating the electronic package according to the present disclosure, the conductive pad 202 of the circuit structure 20 and the end surface 23b of the conductive pillars 23 act as external contacts, and the distance between any two of the external contacts can be controlled to meet the fine-pitch demand. Therefore, the conductive bumps 27 or the conductive elements 24 are prevented from bridging to one another.

In the method for fabricating the electronic package according to the present disclosure, the second electronic component 26 is disposed on the circuit structure 20. As compared with the prior art, the electronic package 2 according to the present disclosure disposes the first electronic component 20 and the second electronic component 26 on two sides of the circuit structure 20, respectively, and has various functions and high performance.

The present disclosure also provides an electronic package 2, which comprises an encapsulation layer 25, a first electronic component 21, a plurality of conductive pillars 23, a circuit structure 20, a second electronic component 26 and circuit portions 240 and 240'.

The encapsulation layer 25 has a first surface 25a and a second surface 25b opposing the first surface 25a.

The first electronic component 21 is embedded in the encapsulation layer 25. A plurality of conductive bodies 22 are bonded and electrically connected to the first electronic component 21, and embedded into the encapsulation layer 25. The end surfaces 22a of the conductive bodies 22 are exposed from the first surface 25a of the encapsulation layer 25.

The conductive pillars 23 are embedded into the encapsulation layer 25, and the end surfaces 23a of the conductive pillars 23 are exposed from the first surface 25a of the conductive pillars 23.

The circuit structure 20 is disposed on the first surface 25a of the encapsulation layer 25 and electrically connected to the conductive pillars 23 and the conductive bodies 22.

The second electronic component 26 is disposed on the circuit structure 20 and electrically connected to the circuit structure 20.

The circuit portions 240 and 240' are disposed on the second surface 25b of the encapsulation layer 25 and electrically connected to the conductive pillars 23.

In an embodiment, the first electronic component 21 has a protection film 211, and the conductive bodies 22 protrudes from the protection film 211.

In an embodiment, the first electronic component 21 has an active surface 21a bonded and electrically connected to the conductive bodies 22, and an inactive surface 21b opposing the active surface 21a.

In an embodiment, the first surface 25a of the encapsulation layer 25 is flush with the end surface 23a of the conductive pillars 23.

In an embodiment, the second surface 25b of the encapsulation layer 25 is flush with another end surface 23b of the conductive pillars 23.

In an embodiment, the first surface 25a of the encapsulation layer 25 is flush with the end surface 22a of the conductive bodies 22.

In an embodiment, the second electronic component 26 is disposed on and electrically connected to the circuit structure 20 via a plurality of conductive bumps 27.

In an embodiment, the circuit portion 24 is a conductive pad and/or an under bump metallurgy.

In an embodiment, the electronic package 2 further comprises a packaging layer 28 formed on the circuit structure 20 and packaging the second electronic component 26.

In an embodiment, the electronic package 2 further comprises a package substrate 2a disposed on the circuit portion 24.

In an embodiment, the conductive pillars 23 have a concave circumferential surface 23c near an end surface 23b (or the seed layer 9a) thereof.

In the electronic package and the method for fabricating the same according to the present disclosure, the designs of the circuit structure and the circuit portion allow the package to be small and have more external contacts, and prevent the external contacts from bridging to one another when applied to a fine-pitch product.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

What is claimed is:

1. A method for fabricating an electronic package, comprising:
   providing a carrying board having an insulation layer;
   disposing a plurality of conductive pillars on the insulation layer;
   removing a portion of a material of an end portion of each of the conductive pillars such that each of the conductive pillars has a concave circumferential surface;
   disposing a first electronic component on the insulation layer;
   forming on the insulation layer an encapsulation layer encapsulating the first electronic component and the conductive pillars and having a first surface, from which an end surface of the conductive pillars is exposed, and a second surface opposing the first surface and bonded to the insulation layer;
   disposing on the first surface of the encapsulation layer a circuit structure electrically connected to the conductive pillars and the first electronic component;
   disposing on the circuit structure a second electronic component electrically connected to the circuit structure;
   removing the carrying board, with the insulation layer remained; and
   after removing the carrying board, forming a circuit portion on the insulation layer and electrically connecting the circuit portion to the conductive pillars.

2. The method of claim 1, further comprising bonding and electrically connecting to the first electronic component a plurality of conductive bodies embedded in the encapsulation layer and electrically connected to the circuit structure.

3. The method of claim 2, wherein the first electronic component has an active surface bonded and electrically connected to the plurality of conductive bodies and an inactive surface opposing the active surface.

4. The method of claim 2, wherein the first surface of the encapsulation layer is flush with an end surface of the conductive bodies.

5. The method of claim 1, wherein the first surface of the encapsulation layer is flush with the end surface of the conductive pillars.

6. The method of claim 1, further comprising providing a conductive bump, via which the second electronic component is disposed on the circuit structure and electrically connected to the circuit structure.

7. The method of claim 1, further comprising forming on the circuit structure a packaging layer packaging the second electronic component.

8. The method of claim 1, wherein the circuit portion is at least one of a conductive pad and an under bump metallurgy.

9. The method of claim 1, further comprising disposing a plurality of conductive elements on the circuit portion.

10. The method of claim 9, further comprising disposing a package substrate on the plurality of conductive elements.

* * * * *